United States Patent
Sasaki et al.

(10) Patent No.: US 12,046,457 B2
(45) Date of Patent: Jul. 23, 2024

(54) ELECTROSTATIC CHUCK, FOCUS RING, SUPPORT BASE, PLASMA PROCESSING APPARATUS, AND PLASMA PROCESSING METHOD

(71) Applicant: Tokyo Electron Limited, Tokyo (JP)

(72) Inventors: Yasuharu Sasaki, Miyagi (JP); Shoichiro Matsuyama, Miyagi (JP); Yohei Uchida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 82 days.

(21) Appl. No.: 16/644,009

(22) PCT Filed: Jun. 3, 2019

(86) PCT No.: PCT/JP2019/022042
§ 371 (c)(1),
(2) Date: Mar. 3, 2020

(87) PCT Pub. No.: WO2019/239946
PCT Pub. Date: Dec. 19, 2019

(65) Prior Publication Data
US 2021/0366694 A1 Nov. 25, 2021

(30) Foreign Application Priority Data
Jun. 12, 2018 (JP) .................. 2018-111972

(51) Int. Cl.
*H01J 37/32* (2006.01)
*H01L 21/683* (2006.01)
*H01L 21/687* (2006.01)

(52) U.S. Cl.
CPC .. *H01J 37/32642* (2013.01); *H01J 37/32715* (2013.01); *H01L 21/6833* (2013.01); *H01L 21/68735* (2013.01); *H01L 21/68757* (2013.01)

(58) Field of Classification Search
CPC .......... H01J 37/32642; H01J 37/32715; H01L 21/6833; H01L 21/68735; H01L 21/68757
(Continued)

(56) References Cited

U.S. PATENT DOCUMENTS 6,475,336 B1 * 11/2002 Hubacek ............. C23C 16/4586
156/345.47
2016/0319428 A1 * 11/2016 Rasheed ........... C23C 16/45565
(Continued)

FOREIGN PATENT DOCUMENTS

| JP | 2000-114353 A | 4/2000 |
|---|---|---|
| JP | 2002-033376 A | 1/2002 |

(Continued)

OTHER PUBLICATIONS

International Search Report issued in PCT/JP2019/022042; mailed Jul. 16, 2019.

*Primary Examiner* — Charlee J. C. Bennett
(74) *Attorney, Agent, or Firm* — Studebaker & Brackett PC

(57) ABSTRACT

An electrostatic chuck according to an exemplary embodiment includes a first region and a second region. The first region has a first upper surface. The first region is configured to hold a substrate disposed on the first upper surface. The second region has a second upper surface. The second region extends in a circumferential direction to surround the first region. The second region is configured to support a focus ring mounted on the second upper surface. The first upper surface and the second upper surface extend along a single flat surface. The first region and the second region provide a space therebetween to separate the first upper surface and the second upper surface from each other.

16 Claims, 10 Drawing Sheets

(58) Field of Classification Search
USPC .............................. 156/345.51; 118/715–733
See application file for complete search history.

(56) References Cited

U.S. PATENT DOCUMENTS

| 2017/0069519 | A1* | 3/2017 | Shiraiwa | H01L 21/6831 |
| 2018/0190526 | A1 | 7/2018 | Hao et al. | |
| 2019/0051501 | A1* | 2/2019 | Koizumi | H01L 21/68735 |
| 2020/0388472 | A1* | 12/2020 | Takayama | H01J 37/32715 |

FOREIGN PATENT DOCUMENTS

| JP | 2008-251639 A | 10/2008 |
| JP | 2012-104579 A | 5/2012 |
| JP | 2016-122740 A | 7/2016 |
| JP | 2017-050468 A | 3/2017 |

\* cited by examiner

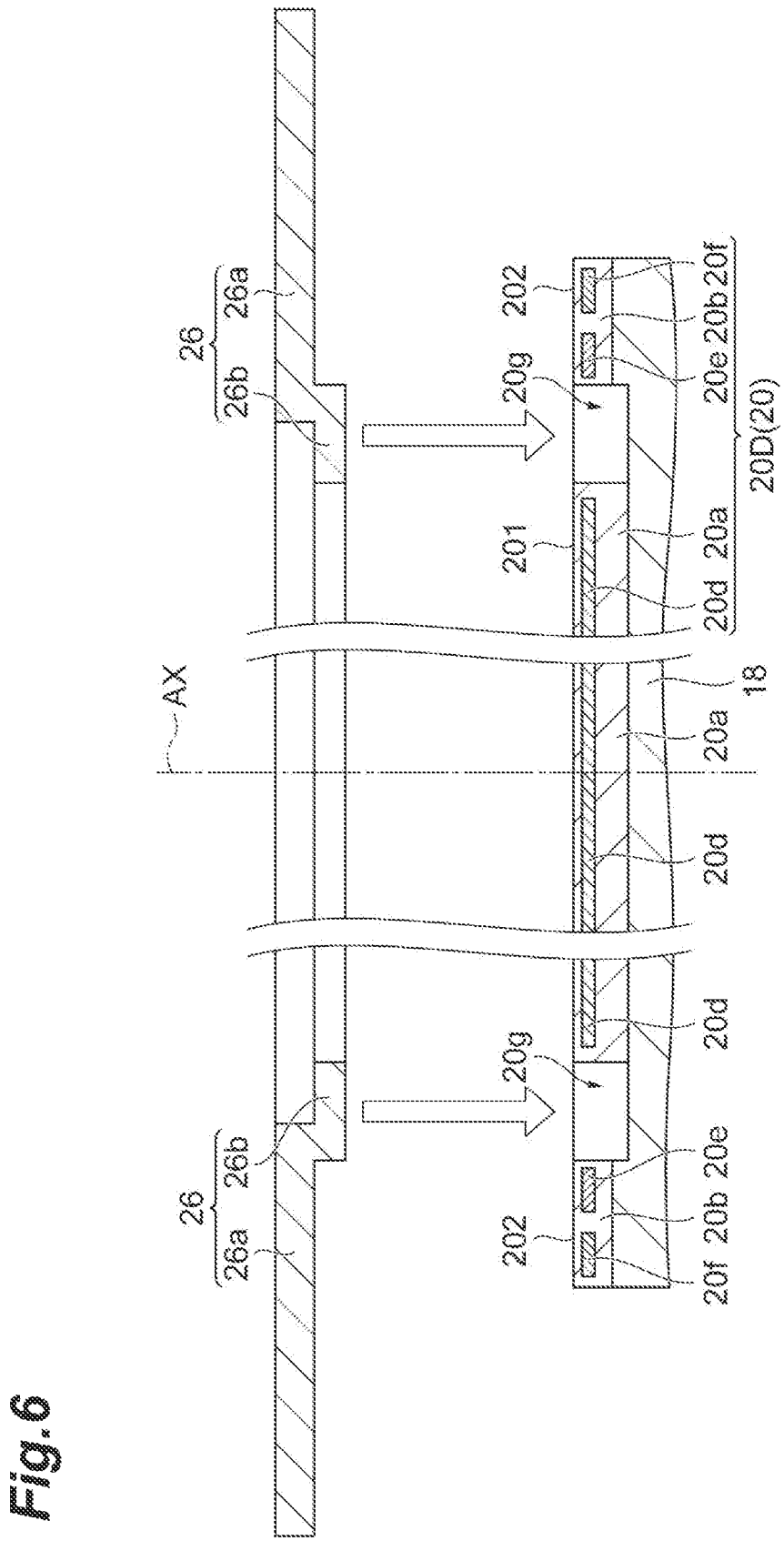

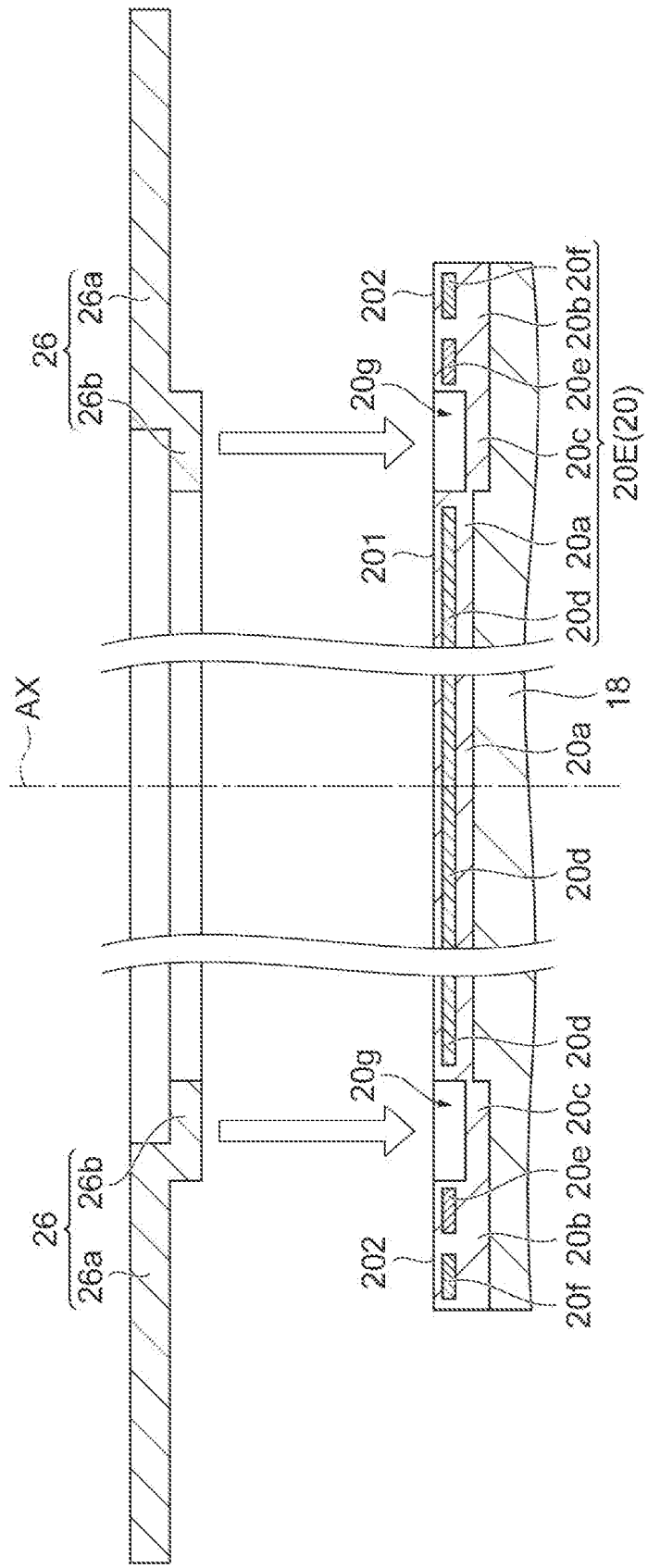

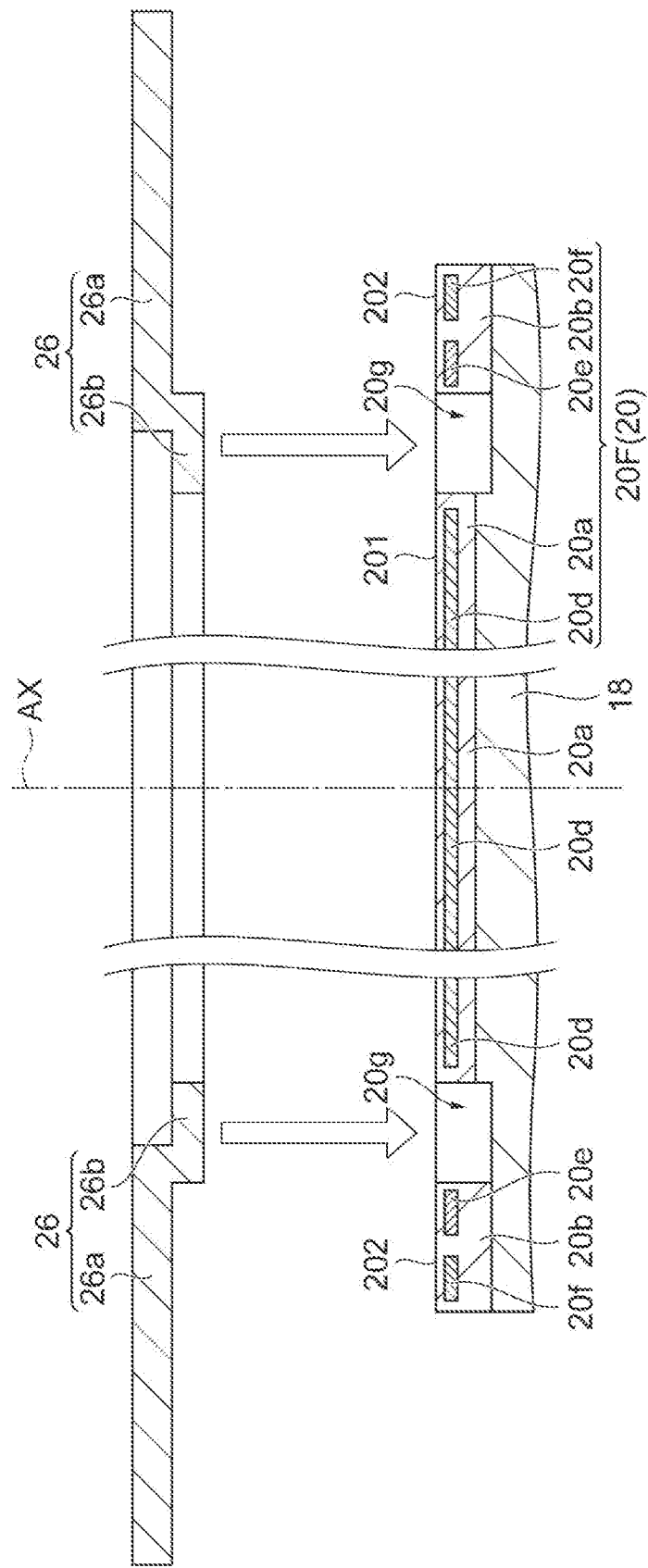

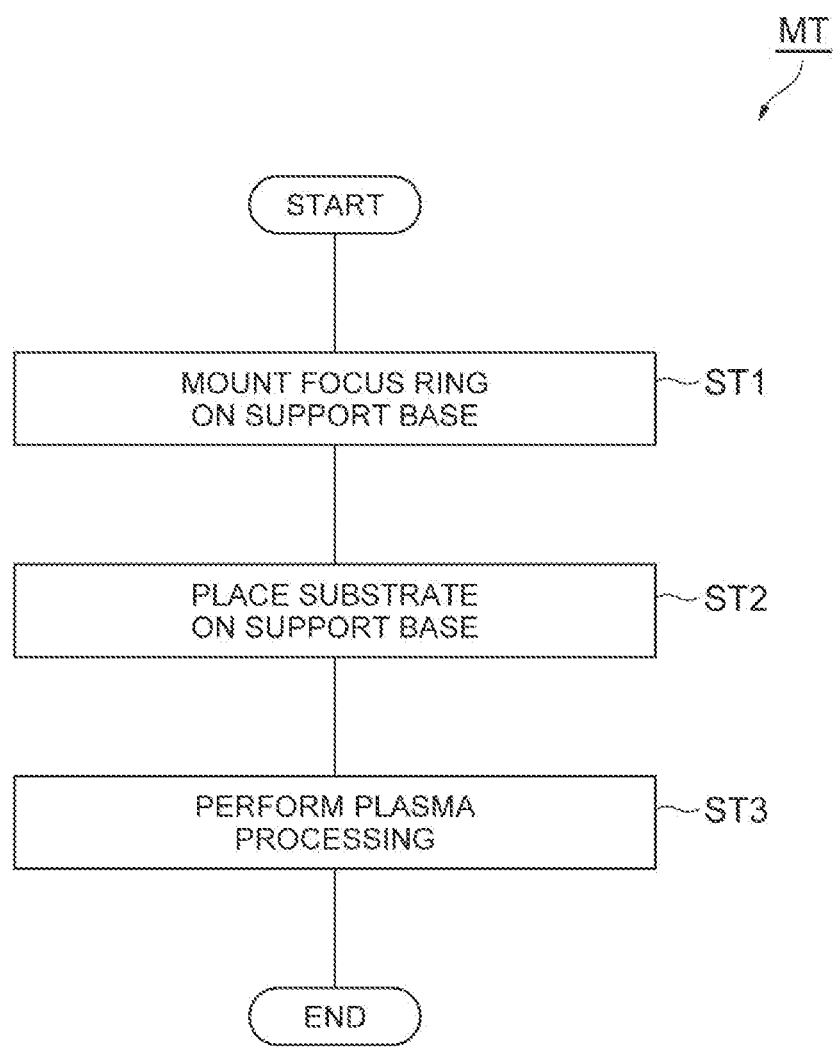

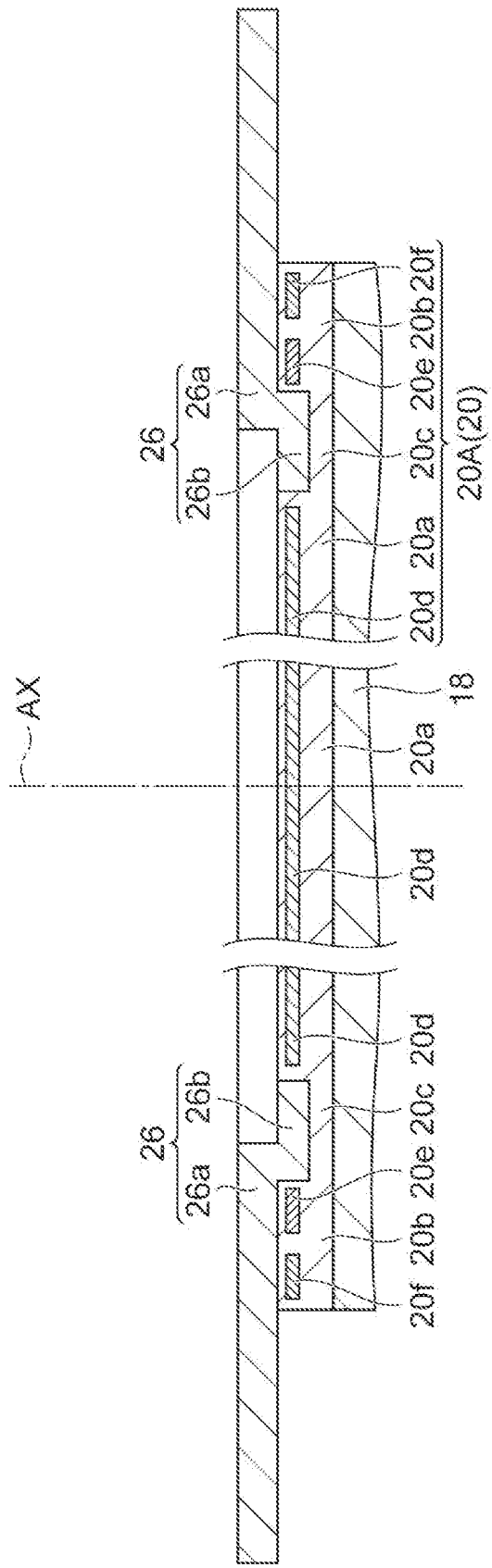

ELECTROSTATIC CHUCK, FOCUS RING, SUPPORT BASE, PLASMA PROCESSING APPARATUS, AND PLASMA PROCESSING METHOD

TECHNICAL FIELD

Exemplary embodiments of the present disclosure relate to an electrostatic chuck, a focus ring, a support base, a plasma processing apparatus, and a plasma processing method.

BACKGROUND ART

In the manufacture of electronic devices, plasma processing is applied to a substrate. In the plasma processing, a plasma processing apparatus is used. The plasma processing apparatus is provided with a chamber and a support base. The support base includes an electrostatic chuck. The substrate is disposed on the electrostatic chuck in the chamber and held by the electrostatic chuck. In order to increase the uniformity of the plasma processing, a focus ring is mounted on the electrostatic chuck to surround the edge of the substrate. Such a plasma processing apparatus is disclosed in Patent Literature 1 and Patent Literature 2.

In the plasma processing apparatus disclosed in Patent Literature 1, an electrostatic chuck has a central portion and an outer peripheral portion. A substrate is disposed on the central portion. The central portion protrudes upward with respect to the outer peripheral portion. The diameter of the central portion is smaller than the diameter of the substrate. A focus ring is mounted on the outer peripheral portion. The focus ring is mounted on the outer peripheral portion to surround the edge of the substrate. The edge region of the substrate is disposed on an inner edge portion of the focus ring.

In the plasma processing apparatus disclosed in Patent Literature 2, an electrostatic chuck has a flat upper surface. A focus ring is mounted on the upper surface of the electrostatic chuck. A substrate is disposed in a region surrounded by the focus ring and on the upper surface of the electrostatic chuck. The edge of the substrate and the focus ring are separated from each other. Therefore, the gap between the edge of the substrate and the focus ring exposes the electrostatic chuck.

CITATION LIST

Patent Literature

[Patent Literature 1] Japanese Patent Application Laid-Open Publication No. 2016-122740
[Patent Literature 2] Japanese Patent Application Laid-Open Publication No. 2012-104579

SUMMARY OF INVENTION

Technical Problem

In order to uniformly process the substrate in a radial direction in the plasma processing, a difference between an electric field above the substrate and an electric field above the focus ring is required to be small. In addition, it is required to suppress damage to the electrostatic chuck due to the plasma processing.

Solution to Problem

In an exemplary embodiment, an electrostatic chuck for supporting a substrate and a focus ring is provided. The electrostatic chuck includes a first region and a second region. The first region has a first upper surface. The first region is configured to hold a substrate disposed on the first upper surface. The second region has a second upper surface. The second region extends in a circumferential direction to surround the first region. The second region is configured to support a focus ring mounted on the second upper surface. The first upper surface and the second upper surface extend along a single flat surface. The first region and the second region provide a space therebetween that separates the first upper surface and the second upper surface from each other.

Advantageous Effects of Invention

In accordance with the electrostatic chuck according to an exemplary embodiment, in a state where a plasma is generated above the electrostatic chuck, a difference between an electric field above the substrate disposed on the first region and an electric field above the focus ring mounted on the second region is reduced. Further, by accommodating an object in the space provided between the first region and the second region, damage to the electrostatic chuck due to plasma processing can be suppressed.

BRIEF DESCRIPTION OF DRAWINGS

FIG. 6 is a cross-sectional view showing an electrostatic chuck and a focus ring according to still another exemplary embodiment.

FIG. 7 is a cross-sectional view showing an electrostatic chuck and a focus ring according to still another exemplary embodiment.

FIG. 8 is a cross-sectional view showing an electrostatic chuck and a focus ring according to still another exemplary embodiment.

FIG. 9 is a flowchart showing a plasma processing method according to an exemplary embodiment.

FIG. 10 is a cross-sectional view showing a state where the focus ring according to an exemplary embodiment is mounted on the electrostatic chuck.

DESCRIPTION OF EMBODIMENTS

Figure 1:
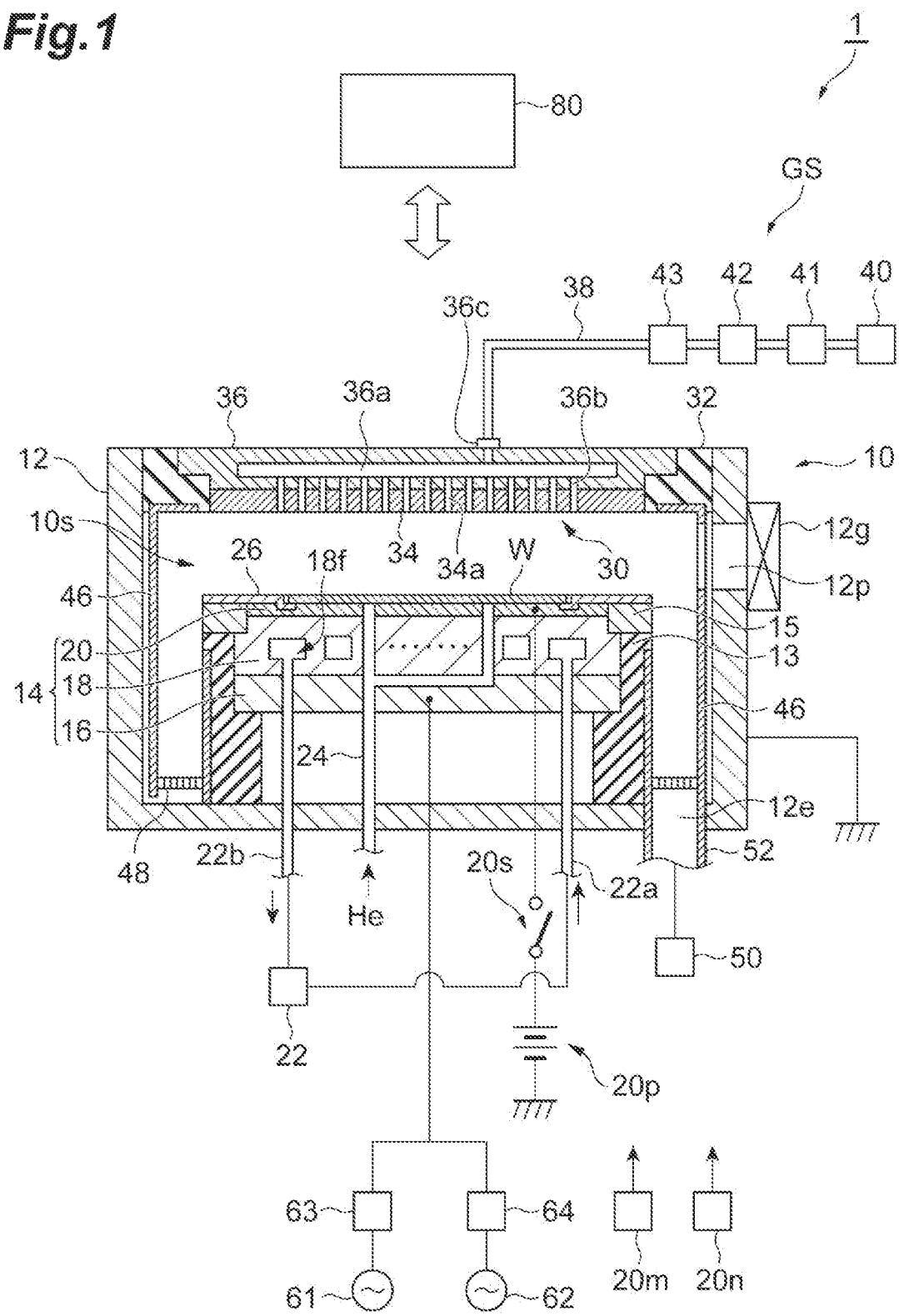
FIG. 1 is a diagram schematically showing a plasma processing apparatus according to an exemplary embodiment.

Hereinafter, various exemplary embodiments will be described.

In an exemplary embodiment, an electrostatic chuck for supporting a substrate and a focus ring is provided. The electrostatic chuck includes a first region and a second region. The first region has a first upper surface. The first region is configured to hold a substrate disposed on the first upper surface. The second region has a second upper surface. The second region extends in a circumferential direction to surround the first region. The second region is configured to support a focus ring mounted on the second upper surface. The first upper surface and the second upper surface extend along a single flat surface. The first region and the second region provide a space therebetween that separates the first upper surface and the second upper surface from each other.

In accordance with the electrostatic chuck according to an exemplary embodiment, the first upper surface and the second upper surface extend along a single flat surface. Therefore, in a state where a plasma is generated above this electrostatic chuck, a difference between an electric field (for example, electric field strength) above the substrate disposed on the first region and an electric field (for example, electric field strength) above the focus ring mounted on the second region is reduced. Further, by accommodating an object in the space provided between the first region and the second region, chemical species from the plasma are suppressed from reaching the electrostatic chuck through the gap between the substrate and the focus ring. Therefore, damage to the electrostatic chuck due to plasma processing is suppressed.

In an exemplary embodiment, a dielectric material constituting the first region and a dielectric material constituting the second region may be the same as each other. In this embodiment, a thickness of the first region and a thickness of the second region are equal to each other.

In an exemplary embodiment, a dielectric constant of one region out of the first region and the second region may be lower than a dielectric constant of the other region. In this embodiment, a thickness of the one region is smaller than a thickness of the other region.

In an exemplary embodiment, the electrostatic chuck may further include a third region provided between the first region and the second region. The third region is connected to the first region and the second region to integrate the first region, the second region, and the third region. The space between the first region and the second region is a groove provided between the first region and the second region and on the third region.

In an exemplary embodiment, the first region and the second region may be formed of different members separated from each other.

In another exemplary embodiment, a focus ring is provided. The focus ring is to be disposed to surround an edge of a substrate in a plasma processing apparatus. The focus ring includes a first portion and a second portion. The first portion has a ring shape. The second portion has a ring shape and shares a central axis with the first portion. The first portion extends on the second portion. An inner diameter of the second portion is smaller than an inner diameter of the first portion. An outer diameter of the second portion is smaller than an outer diameter of the first portion. When the first portion of the focus ring is mounted on the second region of the electrostatic chuck, the second portion can be accommodated in the space between the first region and the second region. Therefore, the second portion suppresses chemical species from the plasma from reaching the electrostatic chuck through the gap between the substrate and the focus ring. Thus, according to the focus ring, damage to the electrostatic chuck due to the plasma processing is suppressed.

In still another exemplary embodiment, a support base is provided. The support base includes an electrode and an electrostatic chuck. The electrostatic chuck is mounted on the electrode. The electrostatic chuck is any one of the various exemplary embodiments described above.

In an exemplary embodiment, the support base may further include a focus ring. The focus ring is the focus ring according to the exemplary embodiment described above. In this support base, the first portion of the focus ring is mounted on the second region of the electrostatic chuck. The second portion of the focus ring is accommodated in the space provided by the electrostatic chuck.

In still another exemplary embodiment, a plasma processing apparatus is provided. The plasma processing apparatus is provided with a chamber and a support base. The support base is configured to support a substrate in the chamber. The support base has an electrode and an electrostatic chuck. The electrostatic chuck is mounted on the electrode. The electrostatic chuck is any one of the various exemplary embodiments described above.

In an exemplary embodiment, the plasma processing apparatus may further include a focus ring. The focus ring is the focus ring according to the exemplary embodiment described above. In this plasma processing apparatus, the first portion of the focus ring is mounted on the second region of the electrostatic chuck. The second portion of the focus ring is accommodated in the space provided by the electrostatic chuck.

In still another exemplary embodiment, a plasma processing method executed using the plasma processing apparatus according to the exemplary embodiment is provided. The plasma processing method includes mounting a focus ring on an electrostatic chuck, disposing a substrate on the electrostatic chuck, and processing the substrate. The processing the substrate is performed using a plasma formed in the chamber in a state where the focus ring is mounted on the electrostatic chuck and the substrate is disposed on the electrostatic chuck. In the plasma processing, the focus ring according to the exemplary embodiment described above is used. In the mounting the focus ring, the focus ring is mounted on the electrostatic chuck such that the first portion of the focus ring is mounted on the second region of the electrostatic chuck, and the second portion of the focus ring is accommodated in the space provided by the electrostatic chuck. In the disposing a substrate, the substrate is disposed on the electrostatic chuck such that an end surface of the substrate faces an inner end surface of the first portion of the focus ring, and an edge region of the substrate is located on the second portion of the focus ring.

Hereinafter, various exemplary embodiments will be described in detail with reference to the drawings. In the drawings, the same or equivalent portions are denoted by the same reference numerals.

FIG. 1 is a diagram schematically showing a plasma processing apparatus according to an exemplary embodiment. A plasma processing apparatus 1 shown in FIG. 1 is a capacitively coupled apparatus. The plasma processing apparatus 1 is provided with a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is formed of, for example, aluminum. A film having corrosion resistance is provided on the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p can be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. A member 15 is provided on the support 13. The member 15 is formed of an insulator such as quartz. The member 15 may have a substantially cylindrical shape. Alternatively, the member 15 may be a plate-shaped body having a ring shape.

The plasma processing apparatus 1 further includes a substrate support base, that is, a support base 14 according to an exemplary embodiment. The support base 14 is supported by the support 13. The support base 14 is provided in the internal space 10s. The support base 14 is configured to support the substrate W in the chamber 10, that is, in the internal space 10s.

The support base 14 includes a lower electrode 18 and an electrostatic chuck 20 according to an exemplary embodiment. The support base 14 may further include an electrode plate 16. The electrode plate 16 is formed of a conductor such as aluminum, for example, and has a substantially disk shape. The lower electrode 18 is provided on the electrode plate 16. The lower electrode 18 is formed of a conductor such as aluminum, for example, and has a substantially disk shape. The lower electrode 18 is electrically connected to the electrode plate 16. The outer peripheral surface of the lower electrode 18 and the outer peripheral surface of the electrode plate 16 are surrounded by the support 13.

The electrostatic chuck 20 is provided on the lower electrode 18. The edge of the electrostatic chuck 20 and the outer peripheral surface of the lower electrode 18 are surrounded by the member 15. The electrostatic chuck 20 is configured to support the substrate W and a focus ring 26 according to an exemplary embodiment. The substrate W has, for example, a disk shape. The substrate W is disposed on the electrostatic chuck 20. The focus ring 26 is mounted on the electrostatic chuck 20 to surround the edge of the substrate W. An outer edge portion of the focus ring 26 may extend on the member 15. Details of the electrostatic chuck 20 and the focus ring 26 will be described later.

A flow path 18f is provided in the interior of the lower electrode 18. A heat exchange medium (for example, a refrigerant) is supplied from a chiller unit 22 provided outside the chamber 10 to the flow path 18f through a pipe 22a. The heat exchange medium supplied to the flow path 18f is returned to the chiller unit 22 through a pipe 22b. In the plasma processing apparatus 1, the temperature of the substrate W disposed on the electrostatic chuck 20 is adjusted by the heat exchange between the heat exchange medium and the lower electrode 18.

The plasma processing apparatus 1 is provided with a gas supply line 24. The gas supply line 24 supplies a heat transfer gas (for example, He gas) from a heat transfer gas supply mechanism between the upper surface of the electrostatic chuck 20 and the back surface of the substrate W.

The plasma processing apparatus 1 further includes an upper electrode 30. The upper electrode 30 is provided above the support base 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a top plate 34 and a support 36. The lower surface of the top plate 34 is a lower surface on the internal space 10s side and defines the internal space 10s. The top plate 34 may be formed of a low resistance conductor or semiconductor with low Joule heat. A plurality of gas discharge holes 34a are formed in the top plate 34. The plurality of gas discharge holes 34a penetrate the top plate 34 in a plate thickness direction thereof.

The support 36 detachably supports the top plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas supply unit GS is connected to the gas supply pipe 38. The gas supply unit GS includes a gas source group 40, a valve group 41, a flow rate controller group 42, and a valve group 43. The gas source group 40 is connected to the gas supply pipe 38 through the valve group 41, the flow rate controller group 42, and the valve group 43. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents an etching byproduct from adhering to the chamber body 12. The shield 46 is configured, for example, by forming a film having corrosion resistance on the surface of a member formed of aluminum. The film having corrosion resistance may be a film formed of ceramic such as yttrium oxide.

A baffle plate 48 is provided between the support 13 and the side wall of the chamber body 12. The baffle plate 48 is configured, for example, by forming a film having corrosion resistance on the surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a first radio frequency power source 61. The first radio frequency power source 61 is configured to generate a first radio frequency power in order to generate a plasma from gas in the chamber 10. The frequency of the first radio frequency power is a frequency in a range of 27 MHz to 100 MHz, for example.

The first radio frequency power source 61 is electrically connected to the lower electrode 18 through a matcher 63.

The matcher 63 has a matching circuit. The matching circuit of the matcher 63 is configured to match the impedance on the load side (lower electrode side) of the first radio frequency power source 61 with the output impedance of the first radio frequency power source 61. In another embodiment, the first radio frequency power source 61 may be electrically connected to the upper electrode 30 through the matcher 63.

The plasma processing apparatus 1 may further include a second radio frequency power source 62. The second radio frequency power source 62 is configured to generate a second radio frequency power. The second radio frequency power has a frequency suitable for mainly drawing ions into the substrate W. The frequency of the second radio frequency power is a frequency in a range of 400 kHz to 13.56 MHz, for example.

The second radio frequency power source 62 is electrically connected to the lower electrode 18 through a matcher 64. The matcher 64 has a matching circuit. The matching circuit of the matcher 64 is configured to match the impedance on the load side (lower electrode side) of the second radio frequency power source 62 with the output impedance of the second radio frequency power source 62.

The plasma processing apparatus 1 may further include the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, the operating status of the plasma processing apparatus 1 can be visualized and displayed by the display device. Furthermore, a control program and recipe data are stored in the storage unit of the controller 80. The control program is executed by the processor of the controller 80 in order to execute various processing in the plasma processing apparatus 1. The processor of the controller 80 executes the control program and controls each part of the plasma processing apparatus 1 according to the recipe data, whereby various processes, for example, a plasma processing method, are executed in the plasma processing apparatus 1.

Figure 2:
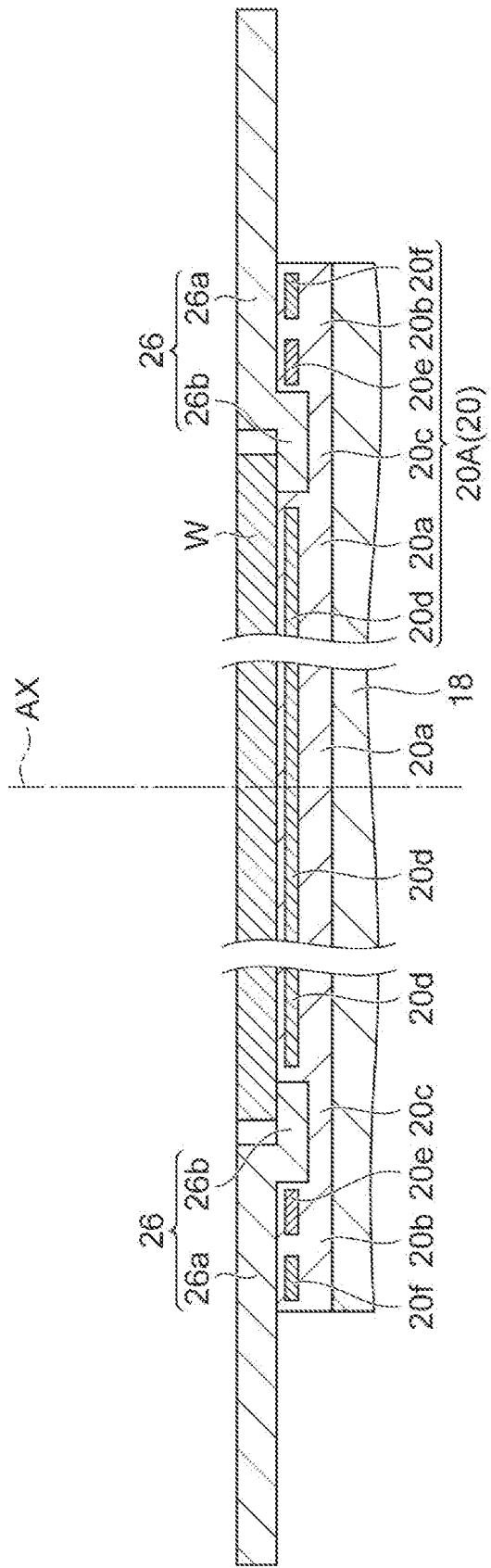
FIG. 2 is a cross-sectional view showing an electrostatic chuck and a focus ring according to an exemplary embodiment.
Figure 3:
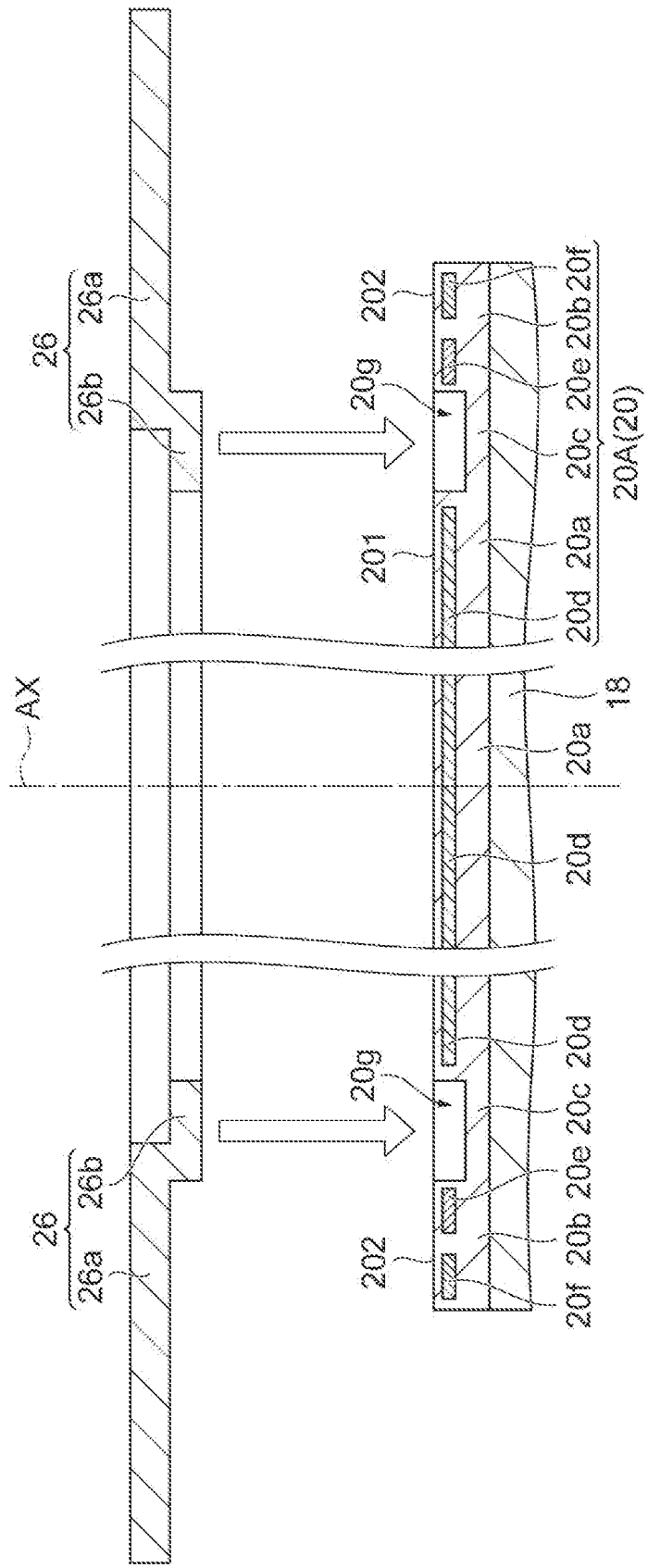
FIG. 3 is a cross-sectional view showing the electrostatic chuck and the focus ring according to an exemplary embodiment.

Hereinafter, the electrostatic chuck and the focus ring will be described in detail. In the following description, FIGS. 2 and 3 will be referred to together with FIG. 1. FIGS. 2 and 3 are cross-sectional views showing the electrostatic chuck and the focus ring according to an exemplary embodiment. FIG. 2 shows a state where the focus ring is mounted on the electrostatic chuck. FIG. 3 shows a state where the focus ring is disposed above the electrostatic chuck. An electrostatic chuck 20A shown in FIGS. 2 and 3 may be used as the electrostatic chuck 20 of the plasma processing apparatus 1.

The electrostatic chuck 20A has a main body. The main body of the electrostatic chuck 20A has a substantially disk shape. The main body of the electrostatic chuck 20A is formed of a dielectric material. The main body of the electrostatic chuck 20A includes a first region 20a, a second region 20b, and a third region 20c.

The first region 20a is a region having a substantially disk shape. The first region 20a has a first upper surface 201. The first region 20a is configured to hold a substrate W disposed on the first upper surface 201. The diameter of the first region 20a is smaller than the diameter of the substrate W.

The electrostatic chuck 20A further includes an electrode 20d. The electrode 20d is a film-shaped electrode. The electrode 20d is provided in the first region 20a. The electrode 20d is connected to a direct-current power source 20p through a switch 20s (see FIG. 1). If the voltage from the direct-current power source 20p is applied to the electrode 20d, an electrostatic attraction force is generated between the first region 20a and the substrate W. Due to the generated electrostatic attraction force, the substrate W is attracted to the first region 20a and held by the first region 20a.

The second region 20b is a region having a ring shape. The second region 20b may further have a plate shape. The second region 20b shares a central axis (the axis AX in FIGS. 2 and 3) with the first region 20a. The second region 20b extends in the circumferential direction with respect to the central axis to surround the first region 20a. The second region 20b has a second upper surface 202. The second region 20b is configured to support a focus ring 26 mounted thereon. The first upper surface 201 of the first region 20a and the second upper surface 202 of the second region 20b extend along a single flat surface (single flat virtual surface).

The electrostatic chuck 20A further includes an electrode 20e and an electrode 20f. Each of the electrode 20e and the electrode 20f is a film-shaped electrode. The electrode 20e and the electrode 20f are provided in the second region 20b. Each of the electrode 20e and the electrode 20f extends in the circumferential direction with respect to the central axis of the electrostatic chuck 20A. The electrode 20f is provided outside the electrode 20e. A direct-current power source 20m is electrically connected to the electrode 20e through a switch, and a direct-current power source 20n is electrically connected to the electrode 20f through a switch (see FIG. 1). A direct-current voltage is applied to each of the electrode 20e and the electrode 20f from the direct-current power source 20m and the direct-current power source 20n such that a potential difference is generated between the electrode 20e and the electrode 20f. For example, the polarity of the direct-current voltage applied to the electrode 20e from the direct-current power source 20m may be opposite to the polarity of the direct-current voltage applied to the electrode 20f from the direct-current power source 20n.

The third region 20c is provided between the first region 20a and the second region 20b. The third region 20c is connected to the first region 20a and the second region 20b to integrate the first region 20a, the second region 20b, and the third region 20c. That is, the main body of the electrostatic chuck 20A is integrated. The main body of the electrostatic chuck 20A, that is, the first region 20a, the second region 20b, and the third region 20c may be formed of a single dielectric material. That is, a dielectric material constituting the first region 20a and a dielectric material constituting the second region 20b may be the same as each other. For example, the main body of the electrostatic chuck 20A may be formed of ceramic such as aluminum oxide or aluminum nitride. In this electrostatic chuck 20A, the thickness of the first region 20a and the thickness of the second region 20b are equal to each other.

The first region 20a and the second region 20b provide a space 20g therebetween. The first upper surface 201 and the second upper surface 202 are separated from each other by the space 20g. The space 20g extends in the circumferential direction with respect to the central axis (the axis AX in FIGS. 2 and 3) of the first region 20a and the second region 20b. The space 20g is a groove in the electrostatic chuck 20A, and is provided between the first region 20a and the second region 20b and on the third region 20c. As described above, the diameter of the first region 20a is smaller than the diameter of the substrate W. Therefore, in a state where the substrate W is disposed on the first upper surface 201, the edge of the substrate W is located on the space 20g.

The focus ring 26 is a member having a ring shape. The focus ring 26 may further have a substantially plate shape. The focus ring 26 may be formed of silicon, silicon carbide, or quartz, but is not limited thereto. The focus ring 26 has a first portion 26a and a second portion 26b.

The first portion 26a has a ring shape. The first portion 26a may further have a plate shape. The inner diameter (diameter) of the first portion 26a is larger than the diameter of the substrate W. The second portion 26b has a ring shape. The second portion 26b may further have a plate shape. The second portion 26b shares the central axis (the axis AX in FIGS. 2 and 3) with the first portion 26a. The first portion 26a extends on the second portion 26b. The inner diameter of the second portion 26b is smaller than the inner diameter of the first portion 26a. The outer diameter of the second portion 26b is smaller than the outer diameter of the first portion 26a and larger than the inner diameter of the first portion 26a. The inner diameter of the second portion 26b is the same as the outer diameter of the first region 20a of the electrostatic chuck 20A (that is, the inner diameter of the space 20g) or larger than the outer diameter of the first region 20a of the electrostatic chuck 20A. The outer diameter of the second portion 26b is the same as the inner diameter of the second region 20b of the electrostatic chuck 20A (that is, the outer diameter of the space 20g) or smaller than the inner diameter of the second region 20b of the electrostatic chuck 20A.

The first portion 26a of the focus ring 26 is mounted on the second region 20b of the electrostatic chuck 20A. Further, the second portion 26b of the focus ring 26 is accommodated in the space 20g provided by the electrostatic chuck 20A. When a direct-current voltage is applied to the electrode 20e from the direct-current power source 20m and a direct-current voltage is applied to the electrode 20f from the direct-current power source 20n, an electrostatic attraction force is generated between the second region 20b and the first portion 26a of the focus ring 26. Due to the generated electrostatic attraction force, the first portion 26a of the focus ring 26 is attracted to the second region 20b of the electrostatic chuck 20A and held by the second region 20b.

As described above, the first upper surface 201 and the second upper surface 202 of the electrostatic chuck 20A extend along a single flat surface (virtual surface). Therefore, in a state where a plasma is generated above the electrostatic chuck 20, a difference between an electric field (for example, electric field strength) above the substrate W disposed on the first region 20a and an electric field (for example, electric field strength) above the focus ring 26 mounted on the second region 20b is reduced.

Further, the focus ring 26 is disposed on the electrostatic chuck 20A such that the second portion 26b is accommodated in the space 20g. The substrate W is disposed on the electrostatic chuck 20A such that an end surface thereof faces an inner end surface of the first portion 26a of the focus ring 26, and an edge region thereof is located on the second portion 26b of the focus ring 26. Therefore, the second portion 26b suppresses chemical species from the plasma generated in the chamber 10 from reaching the electrostatic chuck 20A through the gap between the substrate W and the focus ring 26. Thus, damage to the electrostatic chuck 20A due to the plasma processing is suppressed. It should be noted that a gap may exist between the edge region of the substrate W and the second portion 26b of the focus ring 26.

Figure 4:
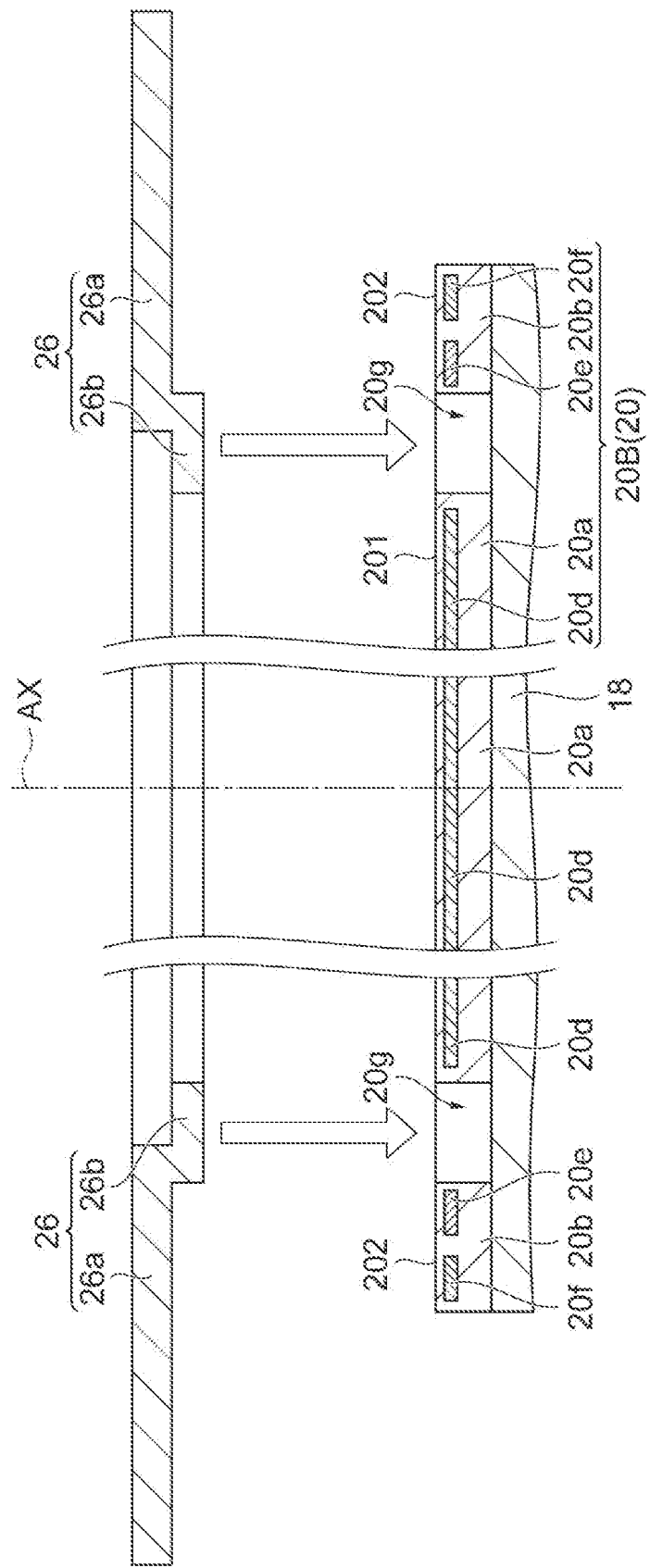
FIG. 4 is a cross-sectional view showing an electrostatic chuck and a focus ring according to another exemplary embodiment.
Figure 5:
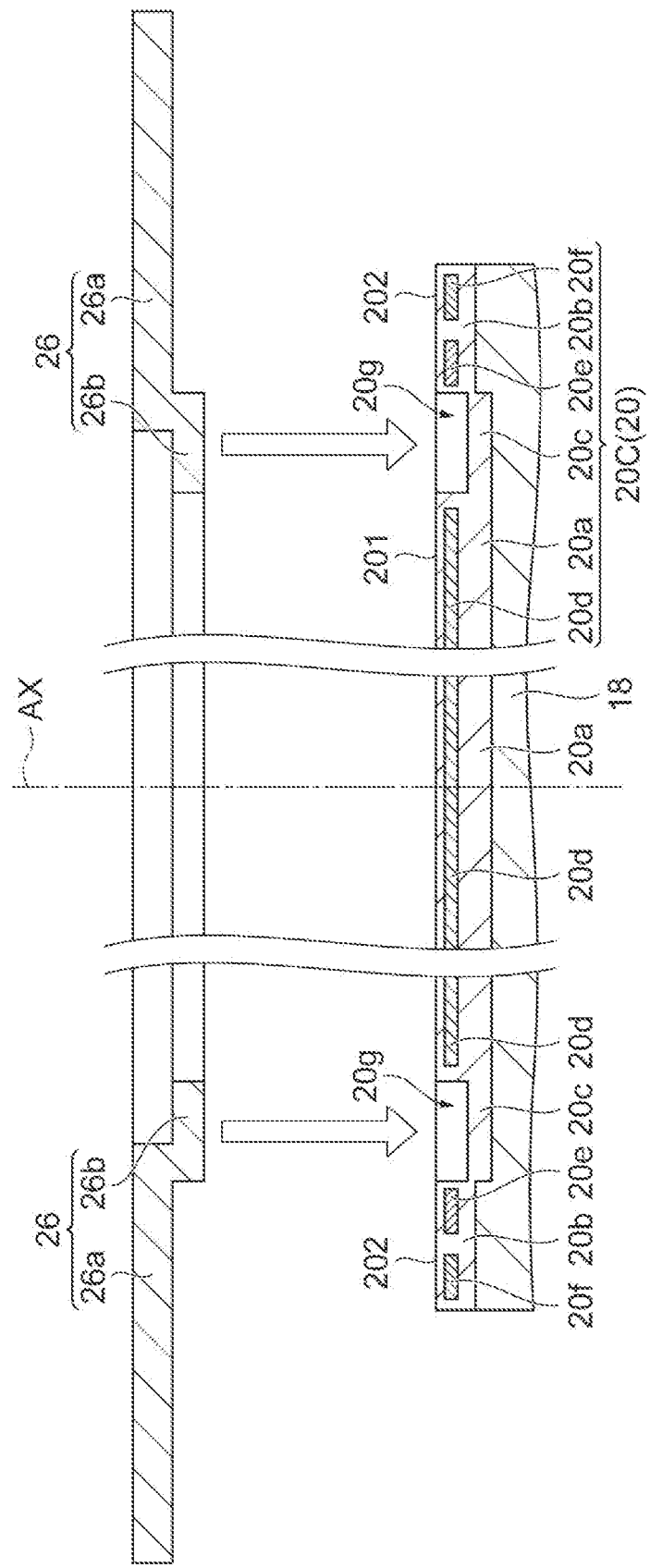
FIG. 5 is a cross-sectional view showing an electrostatic chuck and a focus ring according to still another exemplary embodiment.

Hereinafter, FIG. 4 will be referred to. FIG. 4 is a cross-sectional view showing an electrostatic chuck and a focus ring according to another exemplary embodiment. An electrostatic chuck 20B shown in FIG. 4 may be used as the electrostatic chuck 20 of the plasma processing apparatus 1. The electrostatic chuck 20B differs from the electrostatic chuck 20A in that it does not include the third region 20c. That is, in the electrostatic chuck 20B, the first region 20a and the second region 20b are formed of different members separated from each other. Otherwise, the configuration of the electrostatic chuck 20B is the same as the configuration of the electrostatic chuck 20A.

Hereinafter, FIGS. 5 to 8 will be referred to. Each of FIGS. 5 to 8 is cross-sectional views showing an electrostatic chuck and a focus ring according to still another exemplary embodiment. An electrostatic chuck 20C shown in FIG. 5 may be used as the electrostatic chuck 20 of the plasma processing apparatus 1. In the electrostatic chuck 20C, the thickness of the second region 20b is smaller than the thickness of the first region 20a. In the electrostatic chuck 20C, the dielectric material in the second region 20b is different from the dielectric material in the first region 20a. In the electrostatic chuck 20C, the dielectric constant of the dielectric material in the second region 20b is lower than the dielectric constant of the dielectric material in the first region 20a. Each of the dielectric material in the first region 20a and the dielectric material in the second region 20b may be selected from ceramic such as aluminum oxide and aluminum nitride. The dielectric material of each of the first region 20a and the second region 20b and the thickness of each of the first region 20a and the second region 20b are set such that the capacitance per unit area of the second region 20b is substantially equal to the capacitance per unit area of the first region 20a. Otherwise, the configuration of the electrostatic chuck 20C is the same as the configuration of the electrostatic chuck 20A.

An electrostatic chuck 20D shown in FIG. 6 may be used as the electrostatic chuck 20 of the plasma processing apparatus 1. In the electrostatic chuck 20D, the thickness of the second region 20b is smaller than the thickness of the first region 20a. In the electrostatic chuck 20D, the dielectric material in the second region 20b is different from the dielectric material in the first region 20a. In the electrostatic chuck 20D, the dielectric constant of the dielectric material in the second region 20b is lower than the dielectric constant of the dielectric material in the first region 20a. Each of the dielectric material in the first region 20a and the dielectric material in the second region 20b may be selected from ceramic such as aluminum oxide and aluminum nitride. The dielectric material of each of the first region 20a and the second region 20b and the thickness of each of the first region 20a and the second region 20b are set such that the capacitance per unit area of the second region 20b is substantially equal to the capacitance per unit area of the first region 20a. Otherwise, the configuration of the electrostatic chuck 20D is the same as the configuration of the electrostatic chuck 20B.

An electrostatic chuck 20E shown in FIG. 7 may be used as the electrostatic chuck 20 of the plasma processing apparatus 1. In the electrostatic chuck 20E, the thickness of the second region 20b is larger than the thickness of the first region 20a. In the electrostatic chuck 20E, the dielectric material in the second region 20b is different from the dielectric material in the first region 20a. In the electrostatic chuck 20E, the dielectric constant of the dielectric material in the second region 20b is higher than the dielectric constant of the dielectric material in the first region 20a.

Each of the dielectric material in the first region 20a and the dielectric material in the second region 20b may be selected from ceramic such as aluminum oxide and aluminum nitride. The dielectric material of each of the first region 20a and the second region 20b and the thickness of each of the first region 20a and the second region 20b are set such that the capacitance per unit area of the second region 20b is substantially equal to the capacitance per unit area of the first region 20a. Otherwise, the configuration of the electrostatic chuck 20E is the same as the configuration of the electrostatic chuck 20A.

An electrostatic chuck 20F shown in FIG. 8 may be used as the electrostatic chuck 20 of the plasma processing apparatus 1. In the electrostatic chuck 20F, the thickness of the second region 20b is larger than the thickness of the first region 20a. In the electrostatic chuck 20F, the dielectric material in the second region 20b is different from the dielectric material in the first region 20a. In the electrostatic chuck 20F, the dielectric constant of the dielectric material in the second region 20b is higher than the dielectric constant of the dielectric material in the first region 20a. Each of the dielectric material in the first region 20a and the dielectric material in the second region 20b may be selected from ceramic such as aluminum oxide and aluminum nitride. The dielectric material of each of the first region 20a and the second region 20b and the thickness of each of the first region 20a and the second region 20b are set such that the capacitance per unit area of the second region 20b is substantially equal to the capacitance per unit area of the first region 20a. Otherwise, the configuration of the electrostatic chuck 20F is the same as the configuration of the electrostatic chuck 20B.

Hereinafter, a plasma processing method according to an exemplary embodiment will be described with reference to FIG. 9. FIG. 9 is a flowchart showing a plasma processing method according to an exemplary embodiment. In the following description, FIGS. 1, 2, and 10 will be referred to together with FIG. 9. FIG. 10 is a cross-sectional view showing a state where the focus ring according to an exemplary embodiment is mounted on the electrostatic chuck. The plasma processing method shown in FIG. 9 (hereinafter, referred to as "method MT") is executed using the plasma processing apparatus 1.

In step ST1 of the method MT, the focus ring 26 is mounted on the electrostatic chuck 20. The electrostatic chuck 20 can be any one of the electrostatic chucks 20A to 20F. In step ST1, as shown in FIG. 10, the first portion 26a of the focus ring 26 is mounted on the second region 20b of the electrostatic chuck 20. The second portion 26b of the focus ring 26 is accommodated in the space 20g provided by the electrostatic chuck 20. In step ST1, direct-current voltages having different polarities may be applied to the electrode 20e and the electrode 20f, respectively, in order to hold the focus ring 26 by the second region 20b. It should be noted that, after the substrate W is disposed on the electrostatic chuck 20 in step ST2, the direct-current voltages having different polarities may be applied to the electrode 20e and the electrode 20f, respectively.

In the subsequent step ST2, the substrate W is disposed on the electrostatic chuck 20. As shown in FIG. 2, the substrate W is disposed on the electrostatic chuck 20 such that the end surface thereof faces the inner end surface of the first portion 26a of the focus ring 26, and the edge region thereof is located on the second portion 26b of the focus ring 26. The substrate W is held by the first region 20a by applying a direct-current voltage to the electrode 20d.

The subsequent step ST3 is executed in a state where the focus ring 26 is mounted on the electrostatic chuck 20 and the substrate W is disposed on the electrostatic chuck 20, as shown in FIGS. 1 and 2. In step ST3, the substrate W is processed using the plasma formed in the chamber 10. Specifically, in step ST3, the gas from the gas supply unit GS is supplied into the chamber 10. In step ST3, the exhaust device 50 is controlled such that the pressure in the chamber 10 is set to the specified pressure. In step ST3, the first radio frequency power and/or the second radio frequency power are supplied. In step ST3, the gas in the chamber 10 is excited, and a plasma is generated from the gas. The substrate W is processed by the chemical species from the generated plasma.

While various exemplary embodiments have been described above, various omissions, substitutions and changes may be made without being limited to the exemplary embodiments described above. Elements of the different embodiments may be combined to form another embodiment.

For example, the second region 20b of each of the electrostatic chucks 20A to 20F may have a monopolar electrode instead of the electrode 20e and the electrode 20f which are a bipolar electrode pair. Alternatively, the second region 20b of each of the electrostatic chucks 20A to 20F may not have an electrode. In this case, the focus ring 26 can be held by an adhesive sheet (for example, a gel sheet) provided on the second region 20b.

Further, the plasma processing apparatus including the electrostatic chuck 20 which can be any one of the electrostatic chucks 20A to 20F and mounting the focus ring 26 on the electrostatic chuck 20 may be any type of plasma processing. Further, the method MT can be executed using any type of plasma processing apparatus as long as the plasma processing apparatus includes the electrostatic chuck 20 which can be any one of the electrostatic chucks 20A to 20F and can mount the focus ring 26 on the electrostatic chuck 20. Examples of such a plasma processing apparatus include an inductively coupled plasma processing apparatus and a plasma processing apparatus that generates a plasma by using a surface wave such as a microwave.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

REFERENCE SIGNS LIST 1 plasma processing apparatus
14 support base
20 electrostatic chuck
20a first region
20b second region
20g space
26 focus ring
26a first portion
26b second portion

The invention claimed is:
1. A support base comprising:
a first electrode;
an electrostatic chuck mounted on the first electrode, the electrostatic chuck including a main body formed from at least one dielectric material; and a focus ring, wherein
the main body of the electrostatic chuck comprises:
a first region having a first upper surface and configured to hold a substrate disposed on the first upper surface;
a second region having a second upper surface, extending in a circumferential direction to surround the first region, and configured to support the focus ring disposed on the second upper surface; and
a third region provided between the first region and the second region and connected to the first region and the second region to integrate the first region, the second region, and the third region,
the first upper surface and the second upper surface extend along a single flat surface,
the first region and the second region provide a space therebetween to separate the first upper surface and the second upper surface from each other and to accommodate an inner periphery of the focus ring therein,
the space in which the inner periphery of the focus ring is accommodated is a groove provided between the first region and the second region and on the third region,
a thickness of the inner periphery of the focus ring which is accommodated in the groove is smaller than a thickness of the first region,
the electrostatic chuck further includes a second electrode in the main body,
the main body of the electrostatic chuck includes the first upper surface, the second upper surface, a lower surface opposite to the first upper surface, and a bottom surface defining a bottom of the space,
the second electrode is located above the bottom surface in a vertical direction from the lower surface to the first upper surface, and
the focus ring extends beyond a periphery of the first electrode in a radial direction.

2. The support base according to claim 1, wherein
a dielectric material constituting the first region and a dielectric material constituting the second region are the same as each other, and
the first region and the second region have a same thickness.

3. A support base comprising:
a first electrode;
an electrostatic chuck mounted on the first electrode, the electrostatic chuck including a main body formed from at least one dielectric material; and
a focus ring,
wherein the electrostatic chuck comprises:
a first region having a first upper surface and configured to hold a substrate disposed on the first upper surface;
a second region having a second upper surface, extending in a circumferential direction to surround the first region, and configured to support the focus ring disposed on the second upper surface; and
a third region provided between the first region and the second region and connected to the first region and the second region to integrate the first region, the second region, and the third region, wherein
the first upper surface and the second upper surface extend along a single flat surface,
the first region and the second region provide a space therebetween and on the third region to separate the first upper surface and the second upper surface from each other and to accommodate an inner periphery of the focus ring therein,
a dielectric constant of a material of one region out of the first region and the second region is lower than a dielectric constant of a material of an other region out of the first region and the second region,
the one region has a thickness smaller than a thickness of the other region,
a thickness of the inner periphery of the focus ring is smaller than a thickness of the first region of the electrostatic chuck,
the electrostatic chuck further includes a second electrode in the main body,
the main body of the electrostatic chuck includes the first upper surface, the second upper surface, a lower surface opposite to the first upper surface, and a bottom surface defining a bottom of the space,
the second electrode is located above the bottom surface in a vertical direction from the lower surface to the first upper surface, and
the focus ring extends beyond a periphery of the first electrode in a radial direction.

4. A plasma processing apparatus comprising:
a chamber; and
a support base configured to support a substrate in the chamber, the support base including
a first electrode,
an electrostatic chuck mounted on the first electrode, the electrostatic chuck including a main body formed from at least one dielectric material, and
a focus ring,
wherein the main body of the electrostatic chuck comprises:
a first region having a first upper surface and configured to hold the substrate disposed on the first upper surface;
a second region having a second upper surface, extending in a circumferential direction to surround the first region, and configured to support the focus ring disposed on the second upper surface; and
a third region provided between the first region and the second region and connected to the first region and the second region to integrate the first region, the second region, and the third region, wherein
the first upper surface and the second upper surface extend along a single flat surface,
the first region and the second region provide a space therebetween to separate the first upper surface and the second upper surface from each other and to accommodate an inner periphery of the focus ring therein,
the space in which the inner periphery of the focus ring is accommodated is a groove provided between the first region and the second region and on the third region,
a thickness of the inner periphery of the focus ring which is accommodated in the groove is smaller than a thickness of the first region,
the electrostatic chuck further includes a second electrode in the main body,
the main body of the electrostatic chuck includes the first upper surface, the second upper surface, a lower surface opposite to the first upper surface, and a bottom surface defining a bottom of the space,
the second electrode is located above the bottom surface in a vertical direction from the lower surface to the first upper surface, and
the focus ring extends beyond a periphery of the first electrode in a radial direction.

5. The plasma processing apparatus according to claim 4, wherein the focus ring includes a first portion having a ring shape, and
a second portion having a ring shape and sharing a central axis with the first portion, the first portion extends on the second portion,
the second portion has an inner diameter smaller than an inner diameter of the first portion,
the second portion has an outer diameter smaller than an outer diameter of the first portion,
the first portion of the focus ring is mounted on the second region of the electrostatic chuck, and
the second portion of the focus ring comprises the inner periphery and is accommodated in the space provided by the electrostatic chuck.

6. The plasma processing apparatus according to claim 4, wherein
a dielectric material constituting the first region and a dielectric material constituting the second region are the same as each other, and
the first region and the second region have a same thickness.

7. A plasma processing apparatus comprising:
a chamber; and
a support base configured to support a substrate in the chamber, the support base including
a first electrode,
a focus ring, and
an electrostatic chuck for supporting the substrate and the focus ring, the electrostatic chuck being mounted on the first electrode and including a main body formed from at least one dielectric material,
wherein the main body of the electrostatic chuck comprises:
a first region having a first upper surface and configured to hold the substrate disposed on the first upper surface;
a second region having a second upper surface, extending in a circumferential direction to surround the first region, and configured to support the focus ring disposed on the second upper surface; and
a third region provided between the first region and the second region and connected to the first region and the second region to integrate the first region, the second region, and the third region, wherein
the first upper surface and the second upper surface extend along a single flat surface,
the first region and the second region provide a space therebetween and on the third region to separate the first upper surface and the second upper surface from each other and to accommodate an inner periphery of the focus ring therein,
a dielectric constant of a material of one region out of the first region and the second region is lower than a dielectric constant of a material of an other region out of the first region and the second region,
the one region has a thickness smaller than a thickness of the other region,
a thickness of the inner periphery of the focus ring is smaller than a thickness of the first region,
the electrostatic chuck further includes a second electrode in the main body,
the main body of the electrostatic chuck includes the first upper surface, the second upper surface, a lower surface opposite to the first upper surface, and a bottom surface defining a bottom of the space,
the second electrode is located above the bottom surface in a vertical direction from the lower surface to the first upper surface, and
the focus ring extends beyond a periphery of the first electrode in a radial direction.

8. The plasma processing apparatus according to claim 7, wherein
the space is a groove provided between the first region and the second region and on the third region.

9. The support base according to claim 1, wherein
the focus ring includes
a first portion, and
a second portion which comprises the inner periphery of the focus ring, and
the first portion is provided on the second portion, provides an outer edge of the focus ring, and includes a lower surface, an entirety of which extends horizontally.

10. The support base according to claim 3, wherein
the focus ring includes
a first portion, and
a second portion which comprises the inner periphery of the focus ring, and
the first portion is provided on the second portion, provides an outer edge of the focus ring, and includes a lower surface, an entirety of which extends horizontally.

11. The plasma processing apparatus according to claim 4, wherein
the focus ring includes
a first portion, and
a second portion which comprises the inner periphery of the focus ring, and
the first portion is provided on the second portion, provides an outer edge of the focus ring, and includes a lower surface, an entirety of which extends horizontally.

12. The plasma processing apparatus according to claim 7, wherein
the focus ring includes
a first portion, and
a second portion which comprises the inner periphery of the focus ring, and
the first portion is provided on the second portion, provides an outer edge of the focus ring, and includes a lower surface, an entirety of which extends horizontally.

13. The support base according to claim 9, wherein
the space between the first region and the second region accommodates an entirety of the second portion therein.

14. The support base according to claim 10, wherein
the space between the first region and the second region accommodates an entirety of the second portion therein.

15. The plasma processing apparatus according to claim 11, wherein
the space between the first region and the second region accommodates an entirety of the second portion therein.

16. The plasma processing apparatus according to claim 12, wherein
the space between the first region and the second region accommodates an entirety of the second portion therein.

* * * * *